(12) United States Patent
Liu et al.

(10) Patent No.: US 11,442,517 B2
(45) Date of Patent: Sep. 13, 2022

(54) ON-CHIP PASSIVE POWER SUPPLY COMPENSATION CIRCUIT AND OPERATION UNIT, CHIP, HASH BOARD AND COMPUTING DEVICE USING SAME

(71) Applicant: CANAAN CREATIVE CO., LTD., Beijing (CN)

(72) Inventors: Jieyao Liu, Beijing (CN); Nangeng Zhang, Beijing (CN); Jingjie Wu, Beijing (CN); Shenghou Ma, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 0 days.

(21) Appl. No.: 17/251,659

(22) PCT Filed: Jun. 6, 2019

(86) PCT No.: PCT/CN2019/090434
§ 371 (c)(1),
(2) Date: Dec. 11, 2020

(87) PCT Pub. No.: WO2020/057180
PCT Pub. Date: Mar. 26, 2020

(65) Prior Publication Data
US 2021/0263575 A1 Aug. 26, 2021

(30) Foreign Application Priority Data

Sep. 20, 2018 (CN) .......................... 201811103945.0
Oct. 16, 2018 (CN) .......................... 201811206445.X

(51) Int. Cl.
*G06F 1/26* (2006.01)
*G11C 5/14* (2006.01)

(52) U.S. Cl.
CPC ................ *G06F 1/26* (2013.01); *G11C 5/147* (2013.01)

(58) Field of Classification Search
None
See application file for complete search history.

(56) References Cited

U.S. PATENT DOCUMENTS 5,729,152 A * 3/1998 Leung ................... H04L 25/028
326/21
7,358,771 B1 * 4/2008 Talbot ................ H03K 19/0175
326/82

(Continued)

FOREIGN PATENT DOCUMENTS

CN 208861201 U * 5/2014
CN 105045364 A 11/2015

(Continued)

OTHER PUBLICATIONS

International Search Report and Written Opinion dated Sep. 3, 2019, in related PCT Application No. PCT/CN2019/090434.

*Primary Examiner* — Thomas J. Hiltunen
*Assistant Examiner* — Khareem E Almo
(74) *Attorney, Agent, or Firm* — Maschoff Brennan

(57) ABSTRACT

The invention provides an on-chip passive power supply compensation circuit, and an operational unit, a chip, a hash board and a computing device using the same. The on-chip passive power supply compensation circuit comprises: two or more to-be-powered voltage domains, wherein the to-be-powered voltage domains are connected in series between a power supply and ground; and two or more isolation regions, wherein the to-be-powered voltage domains are formed in the isolation regions, and the isolation regions are configured for isolating the to-be-powered voltage domains; the isolation regions are connected in series between the power supply and the ground, wherein the on-chip passive power (Continued)

supply compensation circuit further comprises power supply compensation units connected between the to-be-powered voltage domains and the isolation regions for providing power supply compensation to the to-be-powered voltage domains.

19 Claims, 10 Drawing Sheets

(56) References Cited

U.S. PATENT DOCUMENTS

| | | | |
|---|---|---|---|
| 9,741,417 B1 * | 8/2017 | Sadd | G11C 11/1655 |
| 10,230,370 B2 * | 3/2019 | Guo | H03K 19/00346 |
| 10,528,069 B2 * | 1/2020 | Hong | H03K 19/0019 |
| 10,742,116 B2 * | 8/2020 | Delshadpour | H02M 1/088 |
| 2004/0076034 A1 * | 4/2004 | Stahl | G11C 11/4094 |
| | | | 365/149 |
| 2005/0169082 A1 * | 8/2005 | Cernea | G11C 11/5642 |
| | | | 365/218 |
| 2018/0089642 A1 | 3/2018 | Suresh et al. | |

FOREIGN PATENT DOCUMENTS

| | | | | |
|---|---|---|---|---|
| CN | 206039425 U | | 3/2017 | |
| CN | 106774767 A | | 5/2017 | |
| CN | 206523836 U | | 9/2017 | |
| CN | 208861201 U | | 5/2019 | |
| CN | 209182771 U | * | 7/2019 | Y02D 10/00 |
| CN | 209182771 U | | 7/2019 | |
| CN | WO-2020057180 A1 | * | 3/2020 | G06F 1/26 |
| CN | 111142641 A | * | 5/2020 | G06F 1/26 |
| WO | WO-2020057180 A1 | * | 3/2020 | G06F 1/26 |

* cited by examiner

ON-CHIP PASSIVE POWER SUPPLY COMPENSATION CIRCUIT AND OPERATION UNIT, CHIP, HASH BOARD AND COMPUTING DEVICE USING SAME

BACKGROUND OF THE INVENTION

1. Field of the Invention

The invention relates to a multi-supply voltage domain power supply circuit, and particularly to a power supply voltage compensation circuit based on a substrate reference, and an operation unit, a chip, a hash board and a computing device using the same.

2. Related Art

Virtual currency (e.g., BTC, ETH) is a digital currency in the form of P2P, and since launching of BTC system in 2009, the virtual currency has attracted widespread attention. The system constructs a distributed share general ledger based on a block chain, thereby ensuring safety, reliability and decentration of system operation.

In terms of hash operation and proof of work, BTC is an only correct hash obtained by computation to prove the proof of work, thereby obtaining bookkeeping package block weight, so an award is received, and this is the proof of work (Pow). Currently, except brute-force computation, no effective algorithm is available for hash operation. As for a new generation computing device for mining virtual digital currency, the process of mining is a production line for performing a large amount of repetitive logic computation.

Core for designing such computing device lies in performance per watt, and a higher performance and a lower power consumption represent a higher efficiency of mining, and also mean that more hashrate can be realized in the case of the same electricity consumption.

In addition, as for the large amount of repetitive logic computation, a large current shall be supplied to the computing device, such that in addition to power consumption required by logical computation, an additional power consumption of the computing device is also large. Therefore, a working current of the computing device shall be reduced, thereby reducing its additional power consumption.

CN206039425U discloses a series power supply circuit. As shown in FIG. 1, a plurality of package units are connected in series between a power supply end VCC and ground. Each package unit comprises one or more groups of elements, each group of elements comprises one to-be-powered chip and one auxiliary power supply unit connected to each other, and a signal level conversion unit is connected in series between the to-be-powered chips in two groups of adjacent elements. Although the series power supply circuit can supply a low power supply voltage to each to-be-powered chip, the series power supply circuit provides series power supply to different package units on the printed circuit board, and cannot realize series power supply between different voltage domains inside the chip.

Multi-supply voltage domain power technique is widely applied to a system-on-chip (SoC) and a multiprocessor computation structure. In a chip applied with the multi-supply voltage domain technique, the chip often includes a plurality of separate voltage domains or voltage islands, and modules in each voltage domain works in an appropriate power supply voltage according to requirements of timing. Generally, as for the module where timing is critical, it often works in a high power supply voltage (VDDH) to meet the requirements of the chip for speed performance. As for the non-critical circuit module, it works in a low power supply voltage (VDDL), even a sub-threshold power supply voltage, to reduce power consumption and energy consumption of the chip.

CN206523836U discloses an on-chip series power supply circuit. As shown in FIG. 2, in the series power supply chip, each of the to-be-powered units can comprises a chip core, or each of the to-be-powered units can comprise a plurality of chip cores connected in parallel. In the chip core of each stage of the voltage domains, the circuit comprises a P-channel Metal Oxide Semiconductor (PMOS) transistor and a N-channel metal oxide semiconductor (NMOS) transistor. In the chip core of each stage of the voltage domains, the substrate of the PMOS transistor is connected to the power supply voltage or the working voltage (VDD) of the voltage domain of the present stage, and VDD of the voltage domain of the present stage is also connected to ground (VSS) of the preceding-stage voltage domain. The series power supply chip further comprises n deep wells for realizing isolation between different voltage domains, and the n deep wells are separately provided and interconnected. Each of the n to-be-powered units is located in one deep well, thereby realizing isolation between different voltage domains on the same chip, and effectively avoiding a short circuit formed between different voltage domains. Although the on-chip series power supply system realizes series power supply between different voltage domains inside the chip, in addition to powering of the power supply VDD, auxiliary voltage sources VDD_1, VDD_2 and the like shall be additionally provided in each voltage domain, which is difficult in designing the auxiliary voltage sources, also occupies a large chip area, and produces large power consumption.

SUMMARY OF THE INVENTION

To solve the above problem, the invention provides an on-chip passive power supply compensation circuit based on a substrate reference, which reduces power consumption and design difficulty, saves a chip area, and reduces production costs.

To realize the above objects, the invention provides an on-chip passive power supply compensation circuit, comprising:

two or more to-be-powered voltage domains, wherein the to-be-powered voltage domains are connected in series between a power supply and ground; and two or more isolation regions, wherein the to-be-powered voltage domains are formed in the isolation regions, and the isolation regions are configured for isolating the to-be-powered voltage domains;

the isolation regions are connected in series between the power supply and the ground;

wherein the on-chip passive power supply compensation circuit further comprises power supply compensation units connected between the to-be-powered voltage domains and the isolation regions for providing power supply compensation to the to-be-powered voltage domains.

In the on-chip passive power supply compensation circuit, the power supply compensation units provide power supply compensation to the to-be-powered voltage domains by working in a saturation state.

In the on-chip passive power supply compensation circuit, a first power supply end and a first ground end are formed at both ends of each of the isolation regions, and the first power supply end and/or the first ground end are configured for supplying a reference voltage to the power supply compensation units.

In the on-chip passive power supply compensation circuit, a second power supply end and a second ground end are formed at both ends of each of the to-be-powered voltage domains, and the power supply compensation units provide power supply compensation to the second power supply end and/or the second ground end.

In the on-chip passive power supply compensation circuit, taking the reference voltage for reference, when a voltage variation range of the second power supply end and/or the second ground end exceeds a threshold value of the power supply compensation units, the power supply compensation units work in the saturation state.

In the on-chip passive power supply compensation circuit, the power supply compensation units are switching transistors.

In the on-chip passive power supply compensation circuit, the switching transistors are PMOS switching transistors and/or NMOS switching transistors.

In the on-chip passive power supply compensation circuit, the PMOS switching transistors and/or the NMOS switching transistors are one or plural.

In the on-chip passive power supply compensation circuit, one or more semiconductor devices are formed in the to-be-powered voltage domains, and the first power supply end and/or the first ground end supply a substrate bias voltage to the semiconductor devices.

In the on-chip passive power supply compensation circuit, the semiconductor devices comprise the PMOS transistors and/or the NMOS transistors, the first power supply end supplies the substrate bias voltage to the PMOS transistors, and the first ground end supplies the substrate bias voltage to the NMOS transistors.

In the on-chip passive power supply compensation circuit, it further comprises a voltage stabilizing unit connected in parallel to both ends of each of the isolation regions.

In the on-chip passive power supply compensation circuit, a first power supply end and a first ground end are formed at both ends of each of the isolation regions, and the first power supply end and/or the first ground end are configured for supplying a reference voltage to the power supply compensation units.

In the on-chip passive power supply compensation circuit, a second power supply end and a second ground end are formed at both ends of each of the to-be-powered voltage domains, and the power supply compensation units provide power supply compensation to the second power supply end and/or the second ground end.

In the on-chip passive power supply compensation circuit, the voltage stabilizing unit is configured for stabilizing a voltage of the first power supply end and/or the first ground end.

In the on-chip passive power supply compensation circuit, the voltage stabilizing unit comprises one or more of a resistor, a capacitor or a diode.

In the on-chip passive power supply compensation circuit, the voltage stabilizing unit is directly connected between the first power supply end and the first ground end, or connected between the first power supply end and the first ground end through an analog switch.

In the on-chip passive power supply compensation circuit, an analog switch is provided between the first ground end and the second ground end.

To realize the above objects, the invention further provides a data operation unit, comprising a control circuit, an operational circuit and a memory circuit interconnected, and one or more on-chip passive power supply compensation circuits, wherein the on-chip passive power supply compensation circuit is any one of the on-chip passive power supply compensation circuits.

To realize the above objects, the invention further provides a chip, comprising any one of the data operation units.

To realize the above objects, the invention further provides a hash board for a computing device, comprising any one of the chips.

To realize the above objects, the invention further provides a computing device, comprising a power supply plate, a control board, a connection board, a radiator and a plurality of hash boards, the control board connected to the hash boards through the connection board, the radiator provided around the hash boards, and the power supply plate configured for supplying a power supply to the connection board, the control board, the radiator and the hash boards, wherein the hash board is any one of the hash boards.

The on-chip passive power supply compensation circuit of the invention can supply a stable working voltage to the to-be-powered voltage domains without an auxiliary power supply, which reduces power consumption and design difficulty, saves a chip area, and reduces production costs.

Hereinafter the invention is described in details with reference to the accompanying drawings and the detailed embodiments, but the invention is not limited thereto.

DETAILED DESCRIPTION

Hereinafter structure principle and working principle of the invention are described in details with reference to the accompanying drawings.

Specific terms are used in the specification and the subsequent claims to refer to specific components. Those skilled in the art shall understand that the manufacturer may give a different name to the same component. The specification and the subsequent claims distinguish components from each other by different functions of the components, instead of different names. In the whole description, the same reference sign represents the same element.

"Comprise" and "include" mentioned in the whole specification and the subsequent claims are open words, and shall be explained as "include but is not limited to". In addition, "connection" herein includes any direct or indirect electrical connection means. Indirect electrical connection means comprises connection through other devices.

Figure 1:
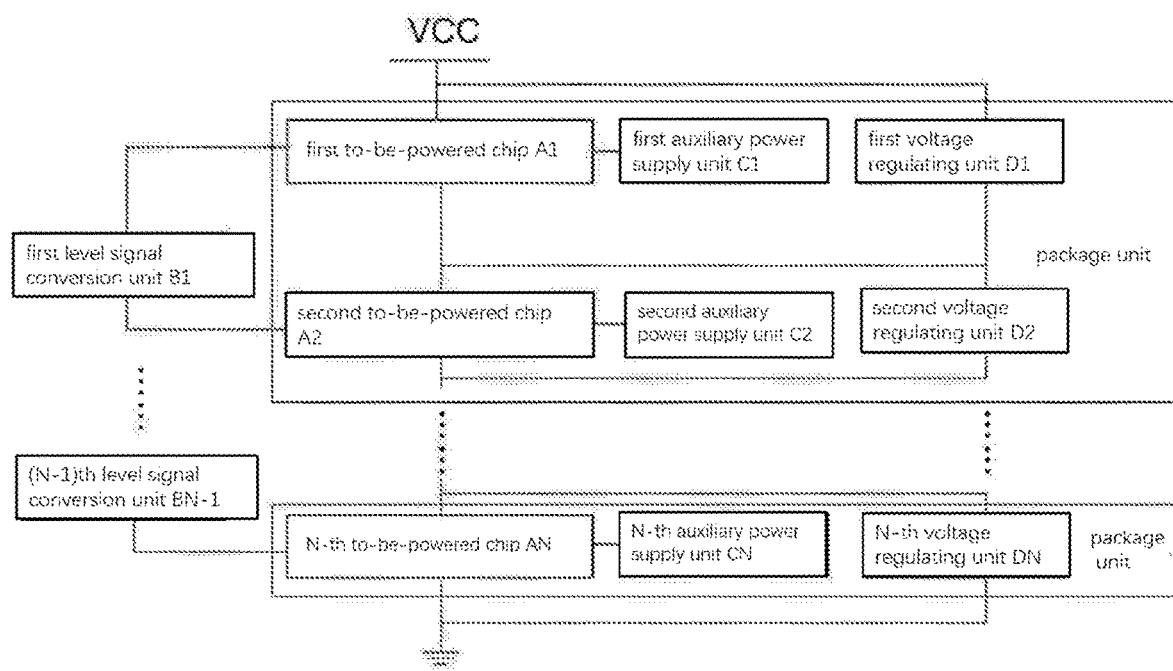
FIG. 1 is a schematic diagram of a series power supply circuit in the prior art.
Figure 2:
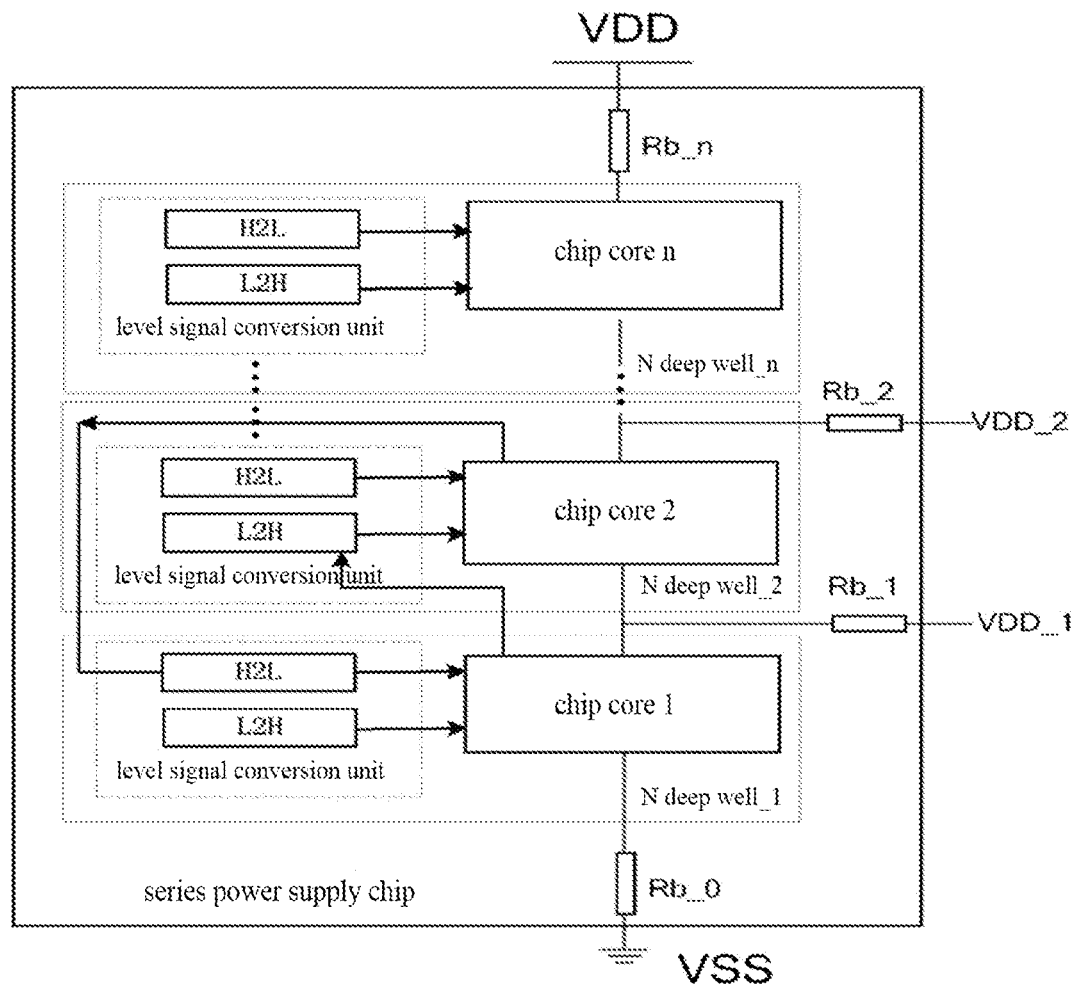
FIG. 2 is a schematic diagram of an on-chip series power supply system in the prior art.
Figure 3:
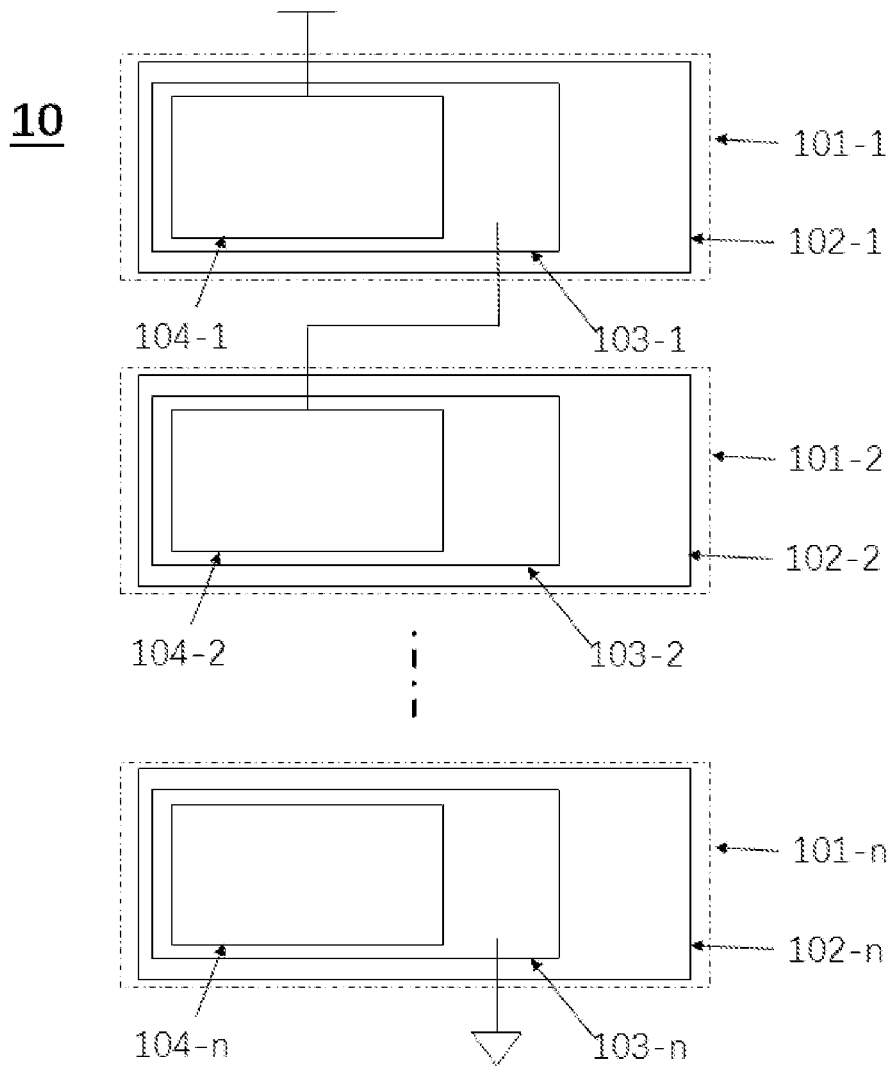
FIG. 3 is a structural diagram of a series power supply circuit without an on-chip passive power supply compensation circuit according to the invention.

FIG. 3 is a structural diagram of a series power supply circuit without an on-chip passive power supply compensation circuit according to the invention. As shown in FIG. 3, taking a chip substrate as a P-type substrate for example, the series power supply circuit 10 is formed with n to-be-powered voltage domains 101-1, 101-2, ..., 101-n, where n is a positive integer greater than 1. Each of the voltage domains 101-1, 101-2, ... 101-n realizes isolation between different voltage domains through one corresponding deep N well 102-1, 102-2, ..., 102-n, respectively, thereby avoiding a short circuit between different voltage domains. Deep N wells 102-1, 102-2, ..., 102-n are formed with a certain number of P wells 103-1, 103-2, ..., 103-n and N wells 104-1, 104-2, ..., 104-n, respectively.

Each of the voltage domains 101-1, 101-2, ... 101-n is formed with a PMOS transistor and/or a NMOS transistor, and if necessary, other types of devices such as, a resistor, a capacitor and the like also can be formed. The PMOS transistors are formed in the N wells 104-1, 104-2, ..., 104-n, and the NMOS transistors are formed in the P wells 103-1, 103-2, ..., 103-n. The PMOS transistors and the NMOS transistors are configured for realizing various functions of the chip.

The to-be-powered voltage domains 101-1, 101-2, ..., 101-n are sequentially connected in series between a system power supply VDD and a system ground GND. A power supply end VDD1 of the voltage domain 101-1 is connected to the system power supply VDD, a ground end VSS1 of the voltage domain 101-1 is connected to a power supply end VDD2 of the next-stage voltage domain 101-2, a ground end VSS2 of the voltage domain 101-2 is connected to a power supply end VDD3 of the next-stage voltage domain 101-3, and so on. A ground end VSSn of the voltage domain 101-n is connected to the system ground GND, thereby forming n voltage domains for series power supply.

The PMOS transistor or the NMOS transistor has four ports S/D/G/B, which are a source end, a drain end, a gate end and a substrate end, respectively. In normal cases, the substrate ends and the source ends of the PMOS transistors in the respective voltage domains 101-1, 101-2, ..., 101-n are connected together to the power supply ends VDD1, VDD2, ..., VDDn of the voltage domains, and the substrate ends and the source ends of the NMOS transistors are connected together to the ground ends VSS1, VSS2, ..., VSSn of the voltage domains. When a voltage between the gate end and the substrate end exceeds a threshold voltage, a conductive path from the source end to the drain end is formed in the substrate, such that current carriers can flow in the substrate between the source end and the drain end to form a current.

When the n voltage domains for series power supply normally work, electric potentials of the power supply ends VDD1, VDD2, ..., VDDn and the ground ends VSS1, VSS2, ..., VSSn of each of the voltage domains are substantially held in a stable state. When one voltage domain 101-m (1≤m≤n) in the n voltage domains for series power supply has a large current, due to the reason of resistance of the voltage domain 101-m itself, a large voltage difference is formed at both ends of the voltage domain 101-m, such that voltages at both ends of the voltage domains without large currents are affected, thereby producing shift of the power supply voltage. With variation of the current, shift is continuously produced, and the shift has a positive correlation with the current, such that function failure of the chip may be caused.

To avoid occurrence of the above case, improvement is often made using the way of adding an auxiliary power supply. That is, one auxiliary power supply is added on each voltage domain to power the voltage domain. The invention provides an on-chip passive power supply compensation circuit based on a substrate reference, which can reduce voltage shift at both ends of the voltage domain without adding an auxiliary power supply.

Embodiment One

Figure 4:
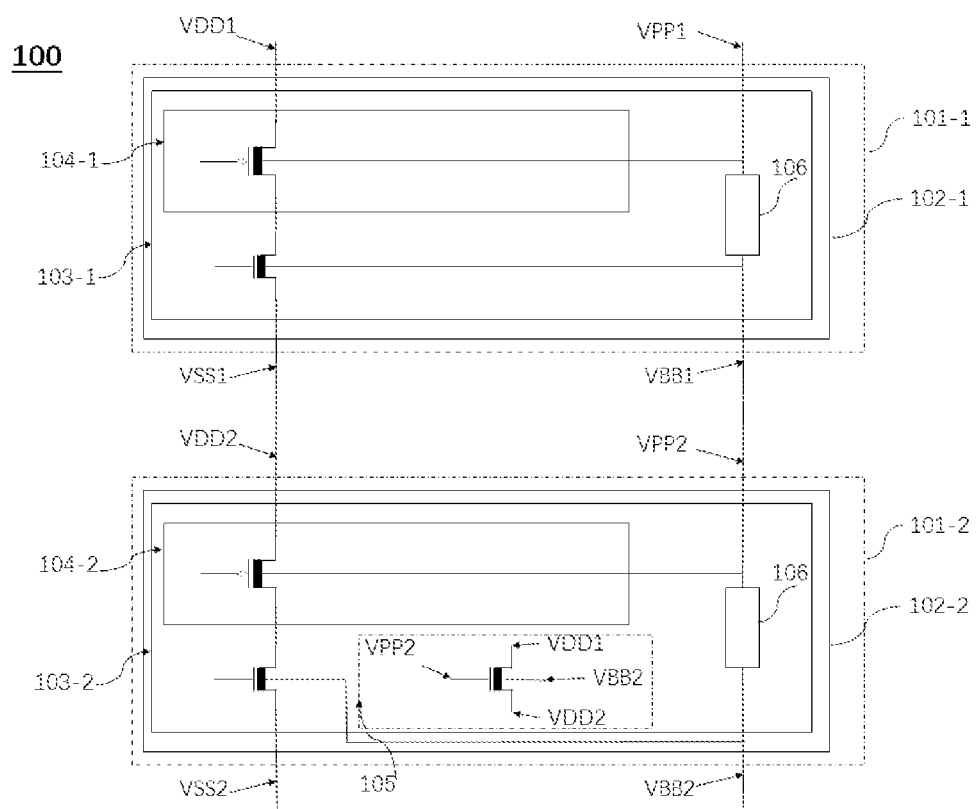
FIG. 4 is a schematic diagram of an on-chip passive power supply compensation circuit in one embodiment of the invention.

FIG. 4 is a schematic diagram of an on-chip passive power supply compensation circuit in one embodiment of the invention. As shown in FIG. 4, taking a chip substrate as a P-type substrate for example, the on-chip passive power supply compensation circuit 100 of the invention is formed with n to-be-powered voltage domains 101-1, 101-2, ..., 101-n, where n is a positive integer greater than 1. Each of the voltage domains 101-1, 101-2, ... 101-n realizes isolation between different voltage domains through one corresponding deep N well 102-1, 102-2, ..., 102-n, respectively, thereby avoiding a short circuit between different voltage domains. Deep N wells 102-1, 102-2, ..., 102-n are formed with a certain number of P wells 103-1, 103-2, ..., 103-n and N wells 104-1, 104-2, ..., 104-n, respectively.

Each of the voltage domains 101-1, 101-2, ... 101-n is formed with a PMOS transistor and/or a NMOS transistor, and if necessary, other types of devices such as, a resistor, a capacitor and the like also can be formed. The PMOS transistors are formed in the N wells 104-1, 104-2, ..., 104-n, and the NMOS transistors are formed in the P wells 103-1, 103-2, ..., 103-n. The PMOS transistors and the NMOS transistors are configured for realizing various functions of the chip.

The to-be-powered voltage domains 101-1, 101-2, ..., 101-n are sequentially connected in series between a system power supply VDD and a system ground GND. A power supply end VDD1 of the voltage domain 101-1 is connected to the system power supply VDD, a ground end VSS1 of the voltage domain 101-1 is connected to a power supply end VDD2 of the next-stage voltage domain 101-2, a ground end VSS2 of the voltage domain 101-2 is connected to a power supply end VDD3 of the next-stage voltage domain 101-3, and so on. A ground end VSSn of the voltage domain 101-n is connected to the system ground GND, thereby forming n voltage domains for series power supply. The power supply end of each of the voltage domains 101-1, 101-2, ..., 101-n is VDD1, VDD2, ..., VDDn, and the ground end is VSS1, VSS2, ..., VSSn.

The deep N wells 102-1, 102-2, ..., 102-n are configured for realizing isolation between different voltage domains. In addition to form the series power supply path, the invention also divides a voltage of the system power supply VDD using a P well and/or a N well volume resistor 106 to produce divisional voltage at both ends of the deep N wells 102-1, 102-2, . . . , 102-n. A power supply end VPP1 of the deep N well 102-1 is connected to the system power supply VDD, a ground end VBB1 of the deep N well 102-1 is connected to a power supply end VPP2 of the next-stage deep N well 102-2, a ground end VBB2 of the deep N well 102-2 is connected to a power supply end VPP3 of the next-stage deep N well 102-3, and so on. The ground end VBBn of the deep N well 102-n is connected to the system ground GND. The deep N wells sequentially connected in series and having relative stable electric potentials at both ends are formed between the system power supply VDD and the ground GND. The power supply ends of the voltage domains 102-1, 102-2, . . . 102-n are VPP1, VPP2, . . . , VPPn, respectively, and the ground ends are VBB1, VBB2, . . . , VBBn, respectively.

In an ideal case, voltages of the power supply ends VDD1, VDD2, . . . , VDDn of the voltage domains 101-1, 101-2, . . . , 101-n are the same as voltages of the power supply ends of VPP1, VPP2, . . . , VPPn of the deep N wells 102-1, 102-2, . . . , 102-n, and voltages of the ground ends VSS1, VSS2, . . . , VSSn of the voltage domains 101-1, 101-2, . . . , 101-n are the same as voltages of the ground ends VBB1, VBB2, . . . , VBBn of the deep N wells 102-1, 102-2, . . . , 102-n.

In this embodiment, the source ends of the PMOS transistors in the respective voltage domains 101-1, 101-2, . . . , 101-n are connected to the power supply ends VDD1, VDD2, . . . , VDDn of the voltage domains, and the substrate ends of the PMOS transistors are connected to the power supply ends VPP1, VPP2, . . . , VPPn of the deep N wells 102-1, 102-2, . . . , 102-n. The source ends of the NMOS transistors in the respective voltage domains 101-1, 101-2, . . . , 101-n are connected to the ground ends VSS1, VSS2, . . . , VSSn of the voltage domains, and the substrate ends of the NMOS transistors are connected to the ground ends VBB1, VBB2, . . . , VBBn of the deep N wells 102-1, 102-2, . . . , 102-n.

In addition, the on-chip passive power supply compensation circuit of the invention further comprises switching transistors 105, and the switching transistors 105 are NMOS transistors formed in the voltage domains 101-2, 101-3, . . . , 101-(n−1). Taking the voltage domain 101-2 for example, the drain end D of the switching transistor 105 in the voltage domain 101-2 is connected to the power supply end VDD1 of the preceding-stage voltage domain 101-1, the source end S of the switching transistor 105 is connected to the power supply end VDD2 of the voltage domain 101-2 of the present stage, the gate end G of the switching transistor 105 is connected to the power supply end VPP2 of the deep N well 102-2 of the present stage, and the substrate end B of the switching transistor 105 is connected to the ground end VBB2 of the deep N well 102-2 of the present stage.

The gate end G and the substrate end B of the switching transistor 105 are connected to VPP2 and VBB2, respectively, and due to influence of gate capacitance and body capacitance of the substrate, current does not flow between the gate electrode and the substrate, thereby holding electric potential of VPP2 to be stable. In an ideal case, the voltage VPP2 of the gate electrode G of the switching transistor 105 is greater than the voltage VBB2 of the substrate end B, thereby forming a conductive channel in the substrate. However, since the voltage VDD1 of the drain end D of the switching transistor is greater than the voltage VPP2 of the gate end G, the voltage VPP2 of the gate end G is the same as the voltage VDD2 of the source end S, i.e., $V_d > V_g = V_s$. In other words, $V_{gs} = 0$. The conductive channel formed in the substrate is pinched off, and current does not flow between the source end S and the drain end D.

When the power supply VDD2 of the voltage domain of the present stage is powered insufficiently, the voltage of VDD2 is decreased, i.e., the voltage of the source end S of the switching transistor 105 is decreased, and since the voltage VPP2 of the gate end G remains constant, a state of $V_{gs} > 0$ is formed. Since $V_{ds} > V_{gs}$, when $V_{gs} = V_{th}$, the switching transistor 105 is turned on to work in a saturation region. At this time, a current between the source end S and the drain end D of the switching transistor 105 is $I_{DS} = [K^*(W/L)^*(V_{gs} - V_{th})^2]/2$. Therefore, VDD1 of the source end S gives sufficient charge supplement to VDD2 of the source end S, and the electric potential of VDD2 is clamped at $(VPP2 - V_{th})$ without further reduction.

Based on the same reason, when the drain end D of the switching transistor 105 is connected to the ground end VSS1 of the preceding-stage voltage domain, and when the source end S is connected to the ground end VSS2 of the voltage domain of the present stage, the electric potential of the voltage domain VSS2 of the present stage can be clamped within a range of $(VSS2 - V_{th})$.

Embodiment Two

Figure 5:
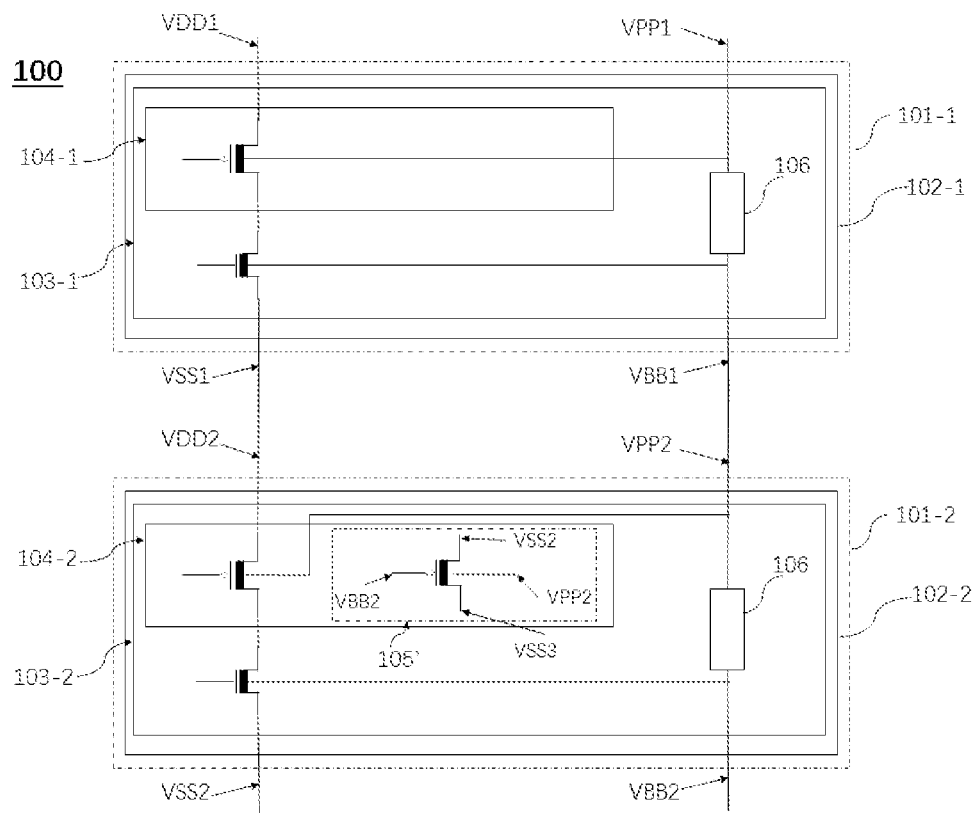
FIG. 5 is a schematic diagram of an on-chip passive power supply compensation circuit in another embodiment of the invention.

FIG. 5 is a schematic diagram of an on-chip passive power supply compensation circuit in another embodiment of the invention. As shown in FIG. 5, this embodiment differs from embodiment one in differences of type and connection way of switching transistors 105'.

In this embodiment, the on-chip passive power supply compensation circuit 100 also comprises switching transistors 105', and the switching transistors 105' are PMOS transistors formed in the voltage domains 101-2, 101-3, . . . , 101-(n−1). Taking the voltage domain 101-2 for example, the drain end D of the switching transistor 105' in the voltage domain 101-2 is connected to the ground end VSS3 of the next-stage voltage domain 101-3, the source end S of the switching transistor 105' is connected to the ground end VSS2 of the voltage domain 101-2 of the present stage, the gate end G of the switching transistor 105' is connected to the ground end VBB2 of the deep N well 102-2 of the present stage, and the substrate end B of the switching transistor 105' is connected to the power supply end VPP2 of the deep N well 102-2 of the present stage.

The gate end G and the substrate end B of the switching transistor 105' are connected to VBB2 and VPP2, respectively, and due to influence of gate capacitance and body capacitance of the substrate, current does not flow between the gate electrode and the substrate, thereby holding electric potentials of VBB2 and VPP2 to be stable. In an ideal case, the voltage VBB2 of the gate electrode G of the switching transistor 105' is greater than the voltage VPP2 of the substrate end B, thereby forming a conductive channel in the substrate. However, since the voltage VSS3 of the drain end D of the switching transistor 105' is less than the voltage VBB2 of the gate end G, the voltage VBB2 of the gate end G is the same as the voltage VSS2 of the source end S, i.e., $V_d > V_g = V_s$. In other words, $V_{gs} = 0$. The conductive channel formed in the substrate is pinched off, and current does not flow between the source end S and the drain end D When an overcurrent is formed in VSS2 of the voltage domain of the present stage, the electric potential of VSS2 is increased, i.e., the voltage of the source end S of the switching transistor 105' is increased, and since the voltage VBB2 of the gate end G remains constant, a state of $V_{gs} < 0$ is formed. A threshold voltage of the switching transistor 105' is $V_{th}$, and since $V_{ds} > V_{gs}$, when $V_{gs} = V_{th}$, the switching transistor 105' is turned on to work in a saturation region. At this time, a current between the source end S and the drain end D of the switching transistor 105' is $I_{DS} = [K*(W/L)*(V_{gs}-V_{th})^2]/2$. Therefore, VSS3 of the drain end D gives sufficient charge relief to VSS2 of the source end S, and the electric potential of VSS2 is clamped within a range of (VSS2+$V_{th}$) without further improvement.

Based on the same reason, when the drain end D of the switching transistor 105' is connected to the power supply end VDD3 of the next-stage voltage domain, and when the source end S is connected to the power supply end VDD2 of the voltage domain of the present stage, the electric potential of the power supply end VDD2 of the voltage domain of the present stage can be clamped within a range of (VDD2+$V_{th}$).

Embodiment Three

Embodiment one and embodiment two only illustrate the case when the switching transistors formed in the same voltage domain are one type, or PMOS transistors, or NMOS transistors, and in different cases, the PMOS transistors and the NMOS transistors also can be formed as switching transistors simultaneously in each voltage domain.

Figure 6:
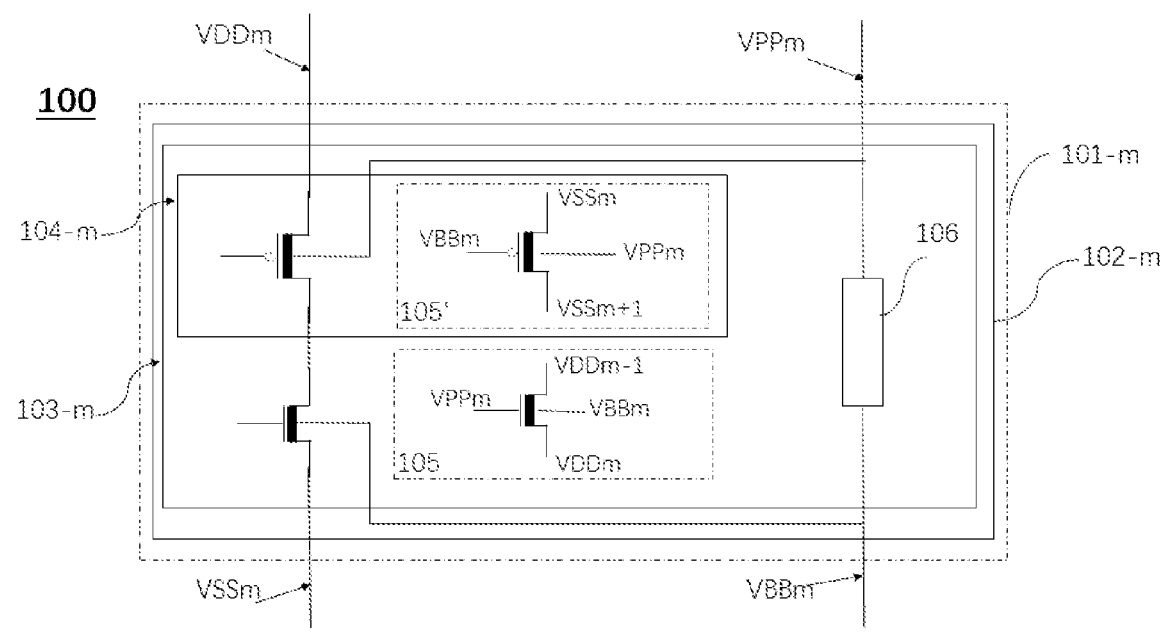
FIG. 6 is a schematic diagram of an on-chip passive power supply compensation circuit in still another embodiment of the invention.

FIG. 6 is a schematic diagram of an on-chip passive power supply compensation circuit in still another embodiment of the invention. As shown in FIG. 6, taking the m-stage voltage domain 101-*m* of the on-chip passive power supply compensation circuit 100 for example, the switching transistor 105 and the switching transistor 105' are formed in the voltage domain 101-*m*. The switching transistor 105 is the NMOS transistor, and the connection way is the same as that of the switching transistor 105 in embodiment one. The switching transistor 105' is the PMOS transistor, and the connection way is the same as that of the switching transistor 105' in embodiment two.

Embodiment Four

Embodiment three illustrates the case when one PMOS transistor and one NMOS transistor are formed as switching transistors simultaneously in the same voltage domain. If only a group of switching transistors 105 and 105' is provided, when a large current variation occurs in an adjacent circuit, compensation can be rapidly made. However, when the circuit at a remote position has a large current variation, compensation cannot be timely made, and a power supply voltage of the entire voltage domain may vary along with a working current, such that the circuit of the entire voltage domain cannot normally work. In actual design and production, the number of the switching transistors can be plural.

Figure 7:
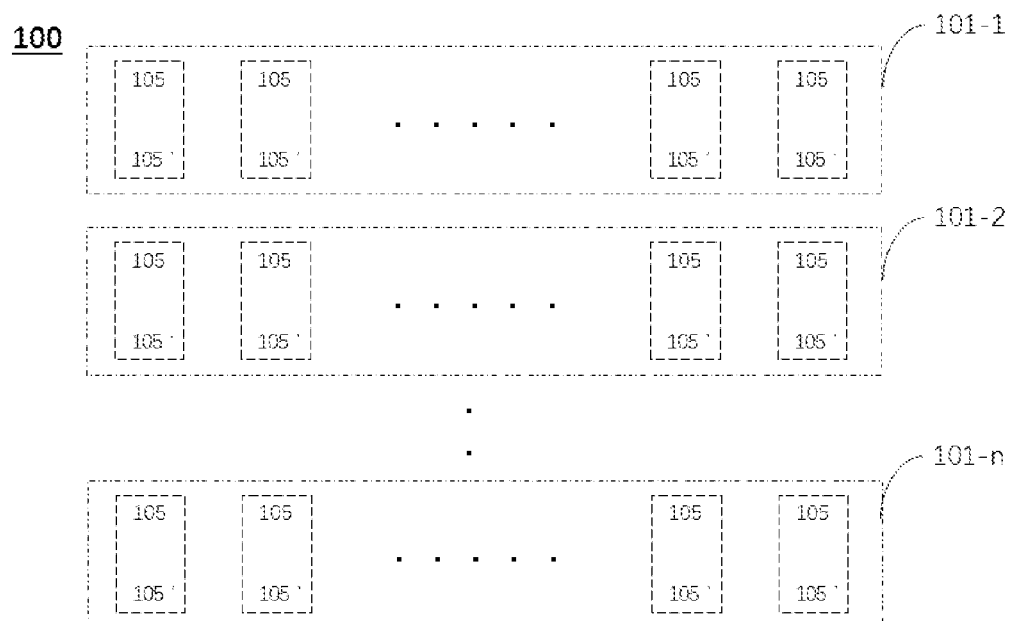
FIG. 7 is a schematic diagram of an on-chip passive power supply compensation circuit in even another embodiment of the invention.

FIG. 7 is a schematic diagram of an on-chip passive power supply compensation circuit in even another embodiment of the invention. As shown in FIG. 7, a plurality of switching transistors 105 and 105' are formed in the voltage domains 101 of each stage of the on-chip passive power supply compensation circuit 100.

In addition to a region forming necessary devices, the voltage domains 101 of each stage also have a certain empty region. To rapidly provide power supply compensation to the adjacent circuit, and improve power supply compensation capability, the switching transistors 105 and 105' can be formed in the empty region of the voltage domains 101 as many as possible, and the specific number can be determined by a size of the empty region of the voltage domains 101.

The formed plural switching transistors 105 and 105' can be uniformly arranged, and also can be non-uniformly arranged.

Embodiment Five

In actual work of the circuit, due to open and/or close of the transistors, the P well and/or N well volume resistor varies, such that voltages of the power supply ends VPP1, VPP2, . . . , VPPn of the deep N wells 102-1, 102-2, . . . , 102-*n* and voltages of the ground ends VBB1, VBB2, . . . , VBBn of the deep N wells 102-1, 102-2, . . . , 102-*n* vary accordingly. To ensure stabilization of the voltages of VPP1, VPP2, . . . , VPPn and the voltages of VBB1, VBB2, . . . , VBBn, the P well and/or N well volume resistor shall be ensured to be held in a relatively constant state, and a voltage stabilizing unit can be connected in parallel to both ends of the P well and/or N well volume resistor 106.

Figure 8:
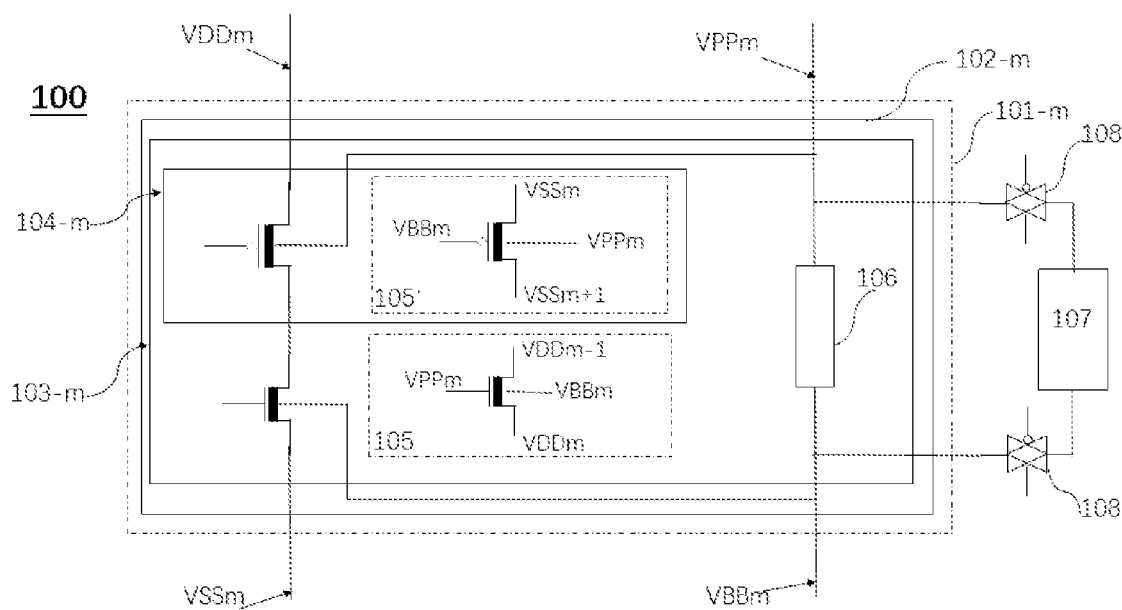
FIG. 8 is a schematic diagram of an on-chip passive power supply compensation circuit comprising a voltage stabilizing unit in one embodiment of the invention.

FIG. 8 is a schematic diagram of an on-chip passive power supply compensation circuit comprising a voltage stabilizing unit in one embodiment of the invention. As shown in FIG. 8, taking the m-stage voltage domain 101-*m* of the on-chip passive power supply compensation circuit 100 for example, a voltage stabilizing unit 107 is connected in parallel to the power supply end VPPm and the ground end VBBm of the deep N well 102-*m*, i.e., corresponding to connect a voltage stabilizing unit 107 in parallel to both ends of the P well volume resistor, and the voltage stabilizing unit 107 can be one or more of a resistor, a capacitor and a diode. The voltage stabilizing unit 107 is not necessary, and can be selected to connect at both ends through an analog switch 108.

Embodiment Six

In actual working procedure of the circuit, voltages of the power supply ends VDD1, VDD2, . . . , VDDn and the ground ends VSS1, VSS2, . . . , VSSn of the respective voltage domains will vary, while voltages of the power supply ends VPP1, VPP2, . . . , VPPn and the ground ends VBB1, VBB2, . . . , VBBn of the deep N wells are held to be relative stable. In an ideal state, the voltages of the ends VDD1, VDD2, . . . , VDDn are the same as that of VPP1, VPP2, . . . , VPPn, and the voltages of the ends VSS1, VSS2, . . . , VSSn are the same as that of VBB1, VBB2, . . . , VBBn.

Figure 9:
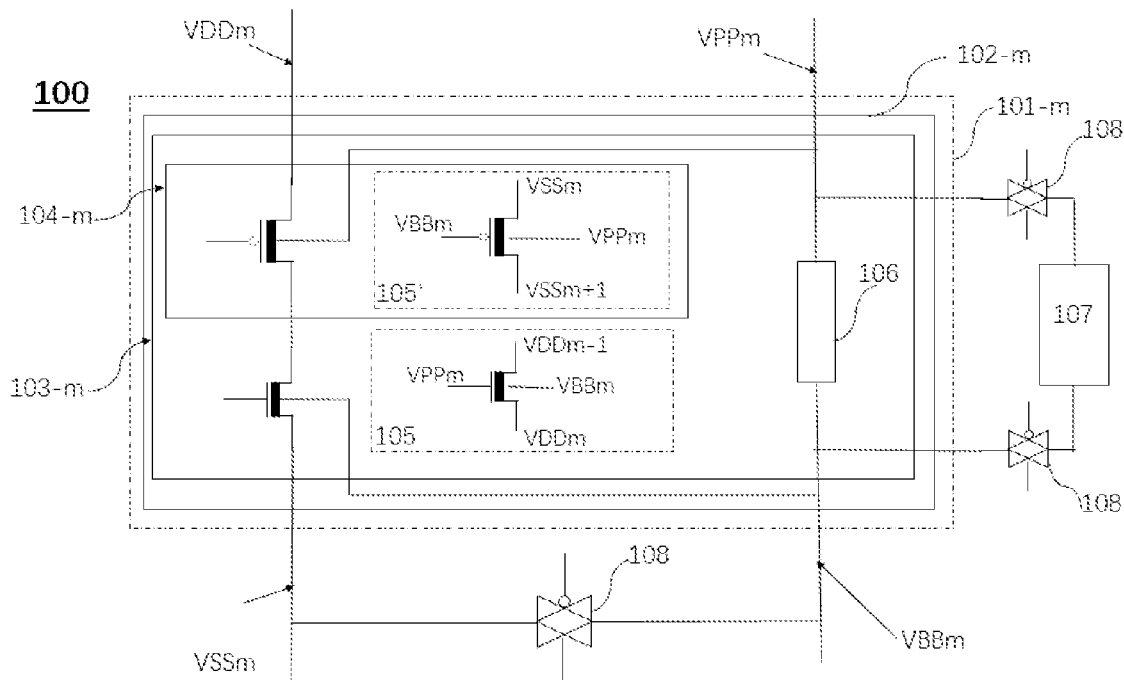
FIG. 9 is a schematic diagram of an on-chip passive power supply compensation circuit comprising a voltage stabilizing unit in another embodiment of the invention.

FIG. 9 is a schematic diagram of an on-chip passive power supply compensation circuit comprising a voltage stabilizing unit in another embodiment of the invention. As shown in FIG. 9, taking the m-stage voltage domain 101-*m* of the on-chip passive power supply compensation circuit 100 for example, the embodiment of FIG. 9 differs from the embodiment of FIG. 8 in that an analog switch 108 is connected between the ground end VSSm of the voltage domain 101-*m* and the ground end VBBm of the deep N well, and whether VSSm is in communication with VBBm can be determined by opening or closing the analog switch 108.

Figure 10:
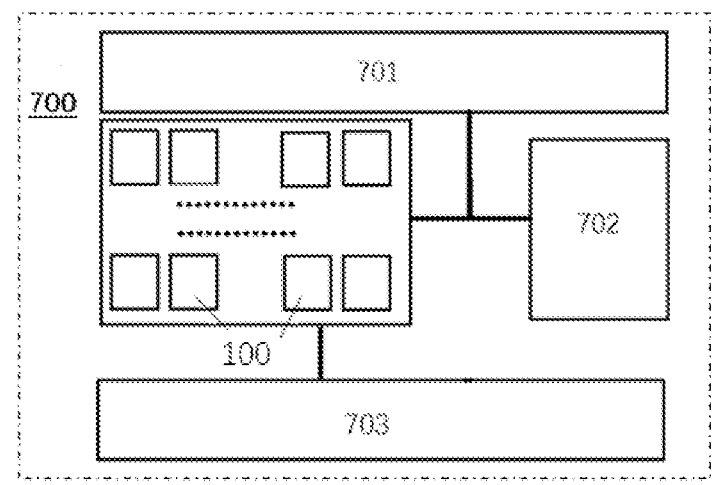
FIG. 10 is a schematic diagram of a data operation unit according to the invention.

The invention further provides a data operation unit, and FIG. 10 is a schematic diagram of a data operation unit according to the invention. As shown in FIG. 10, the data operation unit 700 comprises a control circuit 701, an operational circuit 702, a memory circuit 703, and one or more on-chip passive power supply compensation circuits 100.

Figure 11:
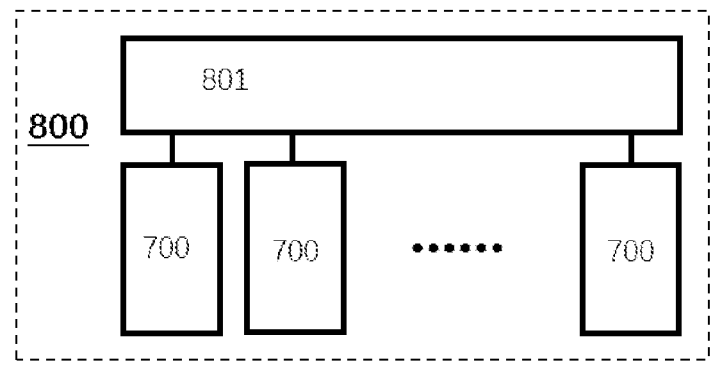
FIG. 11 is a schematic diagram of a chip according to the invention.

The invention further provides a chip, and FIG. 11 is a schematic diagram of a chip according to the invention. As shown in FIG. 11, the chip 800 comprises a control unit 801 and one or more data operation units 700. The control unit 801 inputs data into the data operation units 700, and processes data outputted from the data operation units 700.

Figure 12:
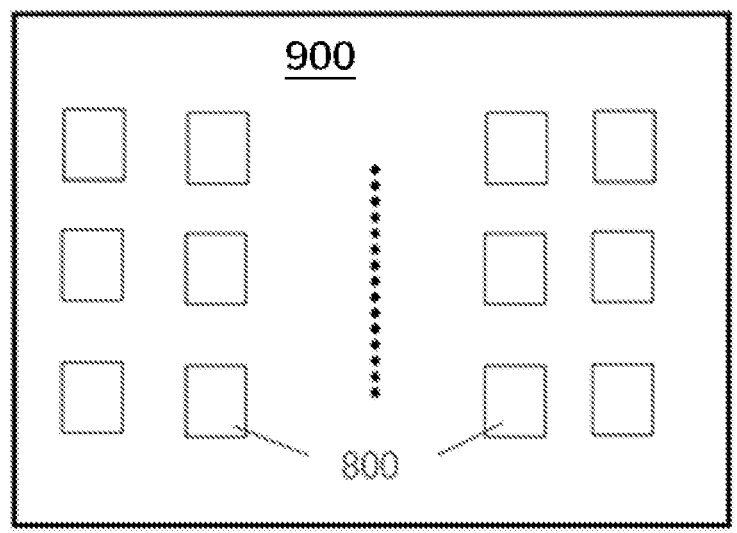
FIG. 12 is a schematic diagram of a hash board according to the invention.

The invention further provides a hash board, and FIG. 12 is a schematic diagram of a hash board according to the invention. As shown in FIG. 12, each of the hash boards 900 comprises one or more chips 800 to perform hash operation on working data sent downstream from a mining pool.

Figure 13:
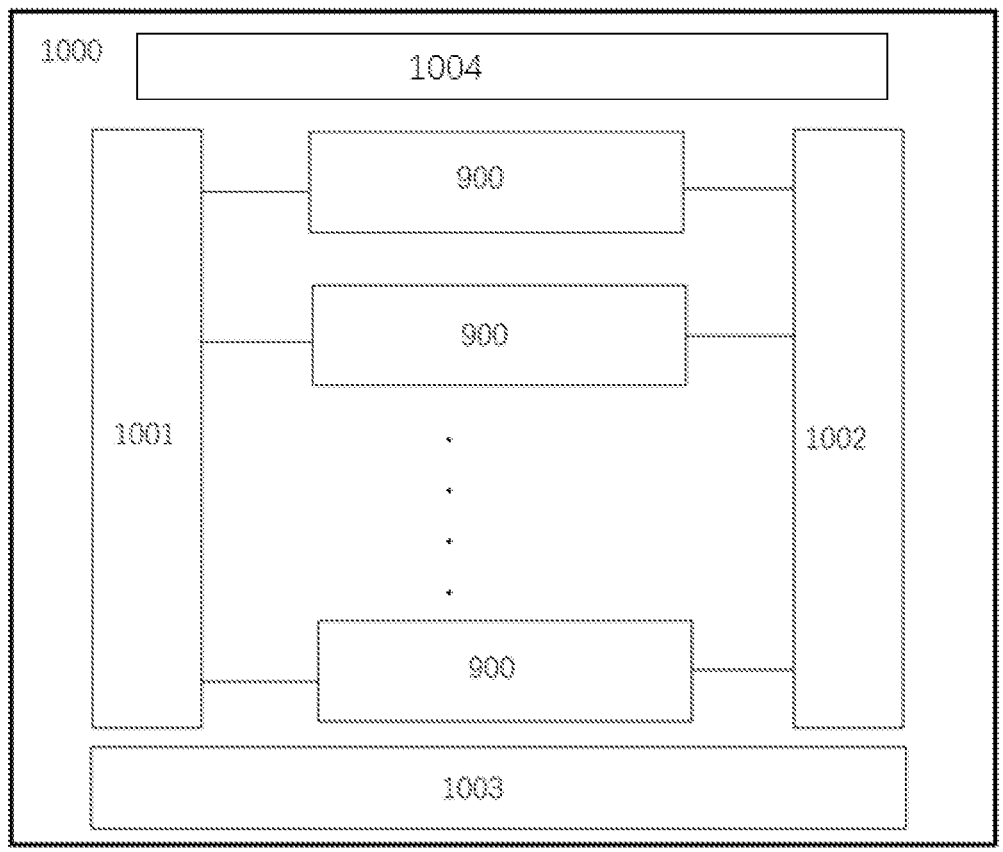
FIG. 13 is a schematic diagram of a computing device according to the invention.

The invention further provides a computing device, and the computing device is preferably configured for operation of mining virtual digital currency. Of course, the computing device also can be configured for any other massive operations. FIG. 13 is a schematic diagram of a computing device according to the invention. As shown in FIG. 13, each of the computing devices 1000 comprises a connection board 1001, a control board 1002, a radiator 1003, a power supply plate 1004 and one or more hash boards 900. The control board 1002 is connected to the hash boards 900 through the connection board 1001, and the radiator 1003 is provided around the hash boards 900. The power supply plate 1004 is configured for supplying a power supply to the connection board 1001, the control board 1002, the radiator 1003 and the hash boards 900.

It shall be noted that in the invention, orientation or positional relationship indicated by the terms "transverse", "longitudinal", "up", "down", "front", "back", "left", "right", "vertical", "horizontal", "top", "bottom", "in", "out", and the like is the orientation or positional relationship illustrated by the drawings, and is only for the purpose of describing the invention and simplifying the explanation, rather than indicating or suggesting that the referred device or element must have specific orientation, and be constructed and operated in specific orientation, so it shall not be understood as limits to the invention.

Although the embodiments of the invention have been disclosed above, they can be fully applied to various fields suitable for the invention but not as limits to those listed in the specification and the embodiments. For those skilled in the art, additional modifications can be easily implemented, so without departing from general concepts defined by the appended claims and equivalent scopes, the invention is not limited to specific details and figures illustrated and described here.

In other words, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

INDUSTRIAL APPLICABILITY

Application of an on-chip passive power supply compensation circuit, and an operation unit, a chip, a hash board and a computing device using the same in the invention has the following advantageous effects:

can supply a stable working voltage to the to-be-powered voltage domains without an auxiliary power supply, which reduces power consumption and design difficulty, saves a chip area, and reduces production costs.

What is claimed is:

1. An on-chip passive power supply compensation circuit, comprising:

two or more to-be-powered voltage domains, wherein the to-be-powered voltage domains are connected in series between a power supply and ground; and two or more isolation regions, wherein the to-be-powered voltage domains are formed in the isolation regions, and the isolation regions are configured for isolating the to-be-powered voltage domains;

the isolation regions are connected in series between the power supply and the ground;

wherein the on-chip passive power supply compensation circuit further comprises power supply compensation units connected between the to-be-powered voltage domains and the isolation regions for providing power supply compensation to the to-be-powered voltage domains;

wherein a first power supply end and a first ground end are formed at both ends of each of the isolation regions, and the first power supply end and/or the first ground end are configured for supplying a reference voltage to the power supply compensation units;

a second power supply end and a second ground end are formed at both ends of each of the to-be-powered voltage domains, and the power supply compensation units provide power supply compensation to the second power supply end and/or the second ground end.

2. The on-chip passive power supply compensation circuit according to claim 1, wherein the power supply compensation units provide power supply compensation to the to-be-powered voltage domains by working in a saturation state.

3. The on-chip passive power supply compensation circuit according to claim 2, wherein taking the reference voltage for reference, when a voltage variation range of the second power supply end and/or the second ground end exceeds a threshold value of the power supply compensation units, the power supply compensation units work in the saturation state.

4. The on-chip passive power supply compensation circuit according to claim 3, wherein the power supply compensation units are switching transistors.

5. The on-chip passive power supply compensation circuit according to claim 4, wherein the switching transistors are PMOS switching transistors and/or NMOS switching transistors.

6. The on-chip passive power supply compensation circuit according to claim 5, wherein the PMOS switching transistors and/or the NMOS switching transistors are one or plural.

7. The on-chip passive power supply compensation circuit according to claim 6, wherein one or more semiconductor devices are formed in the to-be-powered voltage domains, and the first power supply end and/or the first ground end supply a substrate bias voltage to the semiconductor devices.

8. The on-chip passive power supply compensation circuit according to claim 7, wherein the semiconductor devices comprise the PMOS transistors and/or the NMOS transistors, the first power supply end supplies the substrate bias voltage to the PMOS transistors, and the first ground end supplies the substrate bias voltage to the NMOS transistors.

9. The on-chip passive power supply compensation circuit according to claim 1, further comprising a voltage stabilizing unit connected in parallel to both ends of each of the isolation regions.

10. The on-chip passive power supply compensation circuit according to claim 9, wherein a first power supply end and a first ground end are formed at both ends of each of the isolation regions, and the first power supply end and/or the first ground end are configured for supplying a reference voltage to the power supply compensation units.

11. The on-chip passive power supply compensation circuit according to claim 10, wherein a second power supply end and a second ground end are formed at both ends of each of the to-be-powered voltage domains, and the power supply compensation units provide power supply compensation to the second power supply end and/or the second ground end.

12. The on-chip passive power supply compensation circuit according to claim 11, wherein the voltage stabilizing unit is configured for stabilizing a voltage of the first power supply end and/or the first ground end.

13. The on-chip passive power supply compensation circuit according to claim 12, wherein the voltage stabilizing unit comprises one or more of a resistor, a capacitor or a diode.

14. The on-chip passive power supply compensation circuit according to claim 13, wherein the voltage stabilizing unit is directly connected between the first power supply end and the first ground end, or connected between the first power supply end and the first ground end through an analog switch.

15. The on-chip passive power supply compensation circuit according to claim 14, wherein an analog switch is provided between the first ground end and the second ground end.

16. A data operation unit, comprising a control circuit, an operational circuit and a memory circuit interconnected, and one or more on-chip passive power supply compensation circuits, wherein the on-chip passive power supply compensation circuit is the on-chip passive power supply compensation circuit according to claim 1.

17. A chip, comprising at least one of the data operation units according to claim 16.

18. A hash board for a computing device, comprising at least one of the chips according to claim 17.

19. A computing device, comprising a power supply plate, a control board, a connection board, a radiator and a plurality of hash boards, the control board connected to the hash boards through the connection board, the radiator provided around the hash boards, and the power supply plate configured for supplying a power supply to the connection board, the control board, the radiator and the hash boards, wherein the hash board is the hash board according to claim 18.

* * * * *